(12) United States Patent
Rotay et al.

(10) Patent No.: US 7,459,979 B2
(45) Date of Patent: Dec. 2, 2008

(54) SEMICONDUCTOR INDICATOR FOR VOLTAGE DIAGNOSTICS IN POWER AMPLIFIERS

(75) Inventors: Craig J. Rotay, Audubon, PA (US); John Christopher Pritiskutch, Orwigsburg, PA (US); Richard R. Hildenbrandt, Bath, PA (US)

(73) Assignee: STMicroelectronics, Inc., Carrollton, TX (US)

( * ) Notice: Subject to any disclaimer, the term of this patent is extended or adjusted under 35 U.S.C. 154(b) by 139 days.

(21) Appl. No.: 11/263,116

(22) Filed: Oct. 31, 2005

(65) Prior Publication Data
US 2006/0197602 A1 Sep. 7, 2006

Related U.S. Application Data

(60) Provisional application No. 60/658,293, filed on Mar. 3, 2005.

(51) Int. Cl.
*H02H 7/20* (2006.01)
*H03F 3/20* (2006.01)

(52) U.S. Cl. .................... 330/298; 330/289; 330/207 P

(58) Field of Classification Search ................ None
See application file for complete search history.

(56) References Cited

U.S. PATENT DOCUMENTS 6,661,290 B2 * 12/2003 Sugiura .................. 330/289

* cited by examiner

*Primary Examiner*—Robert J. Pascal
*Assistant Examiner*—Alan Wong
(74) *Attorney, Agent, or Firm*—Lisa K. Jorgenson; William A. Munck

(57) ABSTRACT

A semiconductor indicator for quantitatively diagnosing voltage conditions in high power transistor devices is provided. The semiconductor indicator includes a first transistor and a second transistor, where an electrically active periphery of the second transistor is less than an electrically active periphery of the first transistor. The transistors are thermally coupled to one another and may be in close proximity. The second transistor detects the voltage of a node on the first transistor and may be monitored by infrared imaging. The breakdown voltage characteristic of the second transistor may not substantially change as the temperature in the first transistor increases. An optional control circuit monitors and detects the output voltage of the first transistor.

20 Claims, 4 Drawing Sheets

SEMICONDUCTOR INDICATOR FOR VOLTAGE DIAGNOSTICS IN POWER AMPLIFIERS

CROSS-REFERENCE TO RELATED APPLICATIONS

This patent application claims priority under 35 U.S.C. § 119(e) to U.S. Provisional Patent Application No. 60/658,293 entitled "Semiconductor Indicator for Voltage Diagnostics— Concept to Quantatively Determine Low Impedance Voltage in Power Amplifiers" filed on Mar. 3, 2005, which is hereby incorporated by reference.

TECHNICAL FIELD

This disclosure is generally directed to high power semiconductors and more specifically to a system and method for quantitatively diagnosing voltage conditions in high power transistor devices.

BACKGROUND

Currently, in the field of high power amplifiers, there is a need for cost-effective techniques that aid in avoiding high voltage stress. When power semiconductors are occasionally exposed to instantaneous high levels of energy, it often results in significant damage to or destruction of the semiconductors. In addition, instantaneous high voltage often appears in applications having unclamped inductive loads or otherwise having high standing wave load mismatch conditions.

There is also a need for protection against certain voltage stress arising during continuous high-power operation. This condition often leads to a rise in the temperature of the power semiconductor junctions. The temperature rise in turn deleteriously affects various aspects of amplifier performance. In extreme circumstances, the voltage present in the output stage of the amplifier approaches or exceeds the semiconductor's breakdown voltage and inevitably leads to excessive high power dissipation and the eventual catastrophic failure of the semiconductors.

Existing protection methods include, for example, optimizing the power semiconductors and including an external diode clamping circuit. In addition, current practices may include severely limiting or reducing the supply voltage available to the output stage of the amplifier to a level between the breakdown voltage of the semiconductors and the operating voltage present at the absolute contact node of the semiconductors.

Current practices, however, fail to adequately address predicting and measuring the dynamic voltage amplitude at the absolute contact node. As the amplifier's operating frequency increases, this becomes even more difficult. For example, there is often no convenient point-of-access to the actual contact node of a semiconductor because of an interconnecting inductance situated between the actual transistor and its external connections. Thus, as the operating frequency is increased, the terminal impedance diverges from the absolute contact node impedance. Accordingly, designers are forced to surmise conservative estimates of the maximum allowable supply voltage based on a margin assigned to the semiconductor's breakdown voltage. The margin, a highly qualitative figure, includes the effects of the external circuitry and operating conditions, such as dynamic loads and temperature ranges. Therefore, by varying the degree of margin, a designer can mitigate performance, efficiency and damage risks in a manner that may also minimize cost. This balance is difficult to achieve, however, due to the qualitative assessments of dynamic voltage and circuit impedance. The protection methods invariably have adverse effects on system performance and generally increase operating costs.

SUMMARY

This disclosure provides a semiconductor indicator for voltage diagnostics in power amplifiers.

In a first embodiment, an indicator for voltage diagnostics in a power amplifier includes (i) a first transistor having an electrically active periphery and (ii) a second transistor having an electrically active periphery less than the electrically active periphery of the first transistor and thermally coupled to the first transistor. A voltage of a node on the first transistor is detected using the second transistor.

In a second embodiment, a method for voltage diagnostics in a power amplifier includes detecting a voltage of a node on a first transistor using a second transistor. The second transistor has an electrically active periphery less than an electrically active periphery of the first transistor and is thermally coupled to the first transistor.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
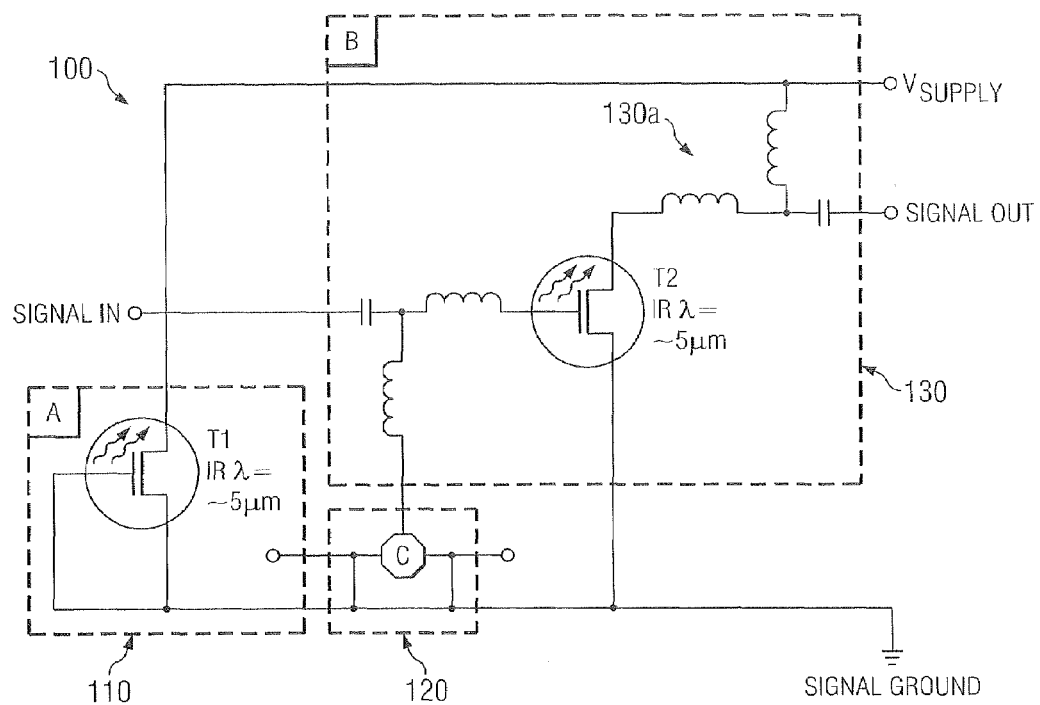
FIG. 1 illustrates an example circuit for quantitatively diagnosing voltage conditions in high power transistor devices according to one embodiment of this disclosure.

FIG. 1 is a schematic of a semiconductor indicator for voltage diagnostics in a power amplifier 100 according to one embodiment of this disclosure. Power amplifier 100 may be contained within a single housing and situated upon a single substrate. In some embodiments, all of the components are processed on the same semiconductor substrate. In other embodiments, components may be processed on different substrates. In this example, indication and diagnostic sub-circuitry 110 includes a transistor (T1), which functions as a detector, and a controller circuit 120. It should be understood that controller circuit 120 is optional and may be configured in several different alternative embodiments, including, for example, an infrared sensor and controller.

Transistor (T1) incorporates identical semiconductor technologies, processes and architecture as transistor (T2) shown in sub-circuit 130. Sub-circuit 130 also includes, for example, output circuit 130a. Transistor (T1), however, may have a substantially smaller amount of electrically active periphery compared to that of transistor (T2). Having a large periphery ratio serves to reduce parasitic capacitance, which in turn minimizes the influence of transistor (T1) on the absolute contact node impedance and increases the sensitivity of the transistor (T1).

Figure 2:
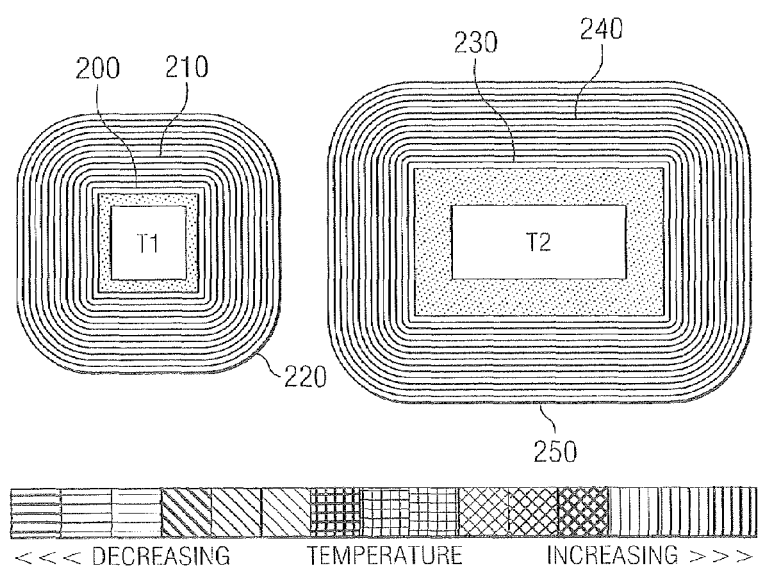
FIG. 2 illustrates an example thermal gradient between two transistors according to one embodiment of this disclosure.

From a diagnostic standpoint, the physical distance between transistors (T1) and (T2) is governed by the extent to which thermal infrared (IR) energy can be distinguished between the region of low power dissipation at transistor (T1) and the region of high power dissipation at transistor (T2). Referring now to FIG. 2, a thermal gradient exists between transistor (T1) and transistor (T2). FIG. 2 also illustrates that the temperature increases as the distance from the transistor (T1) increases. For example, arbitrary point 200 exhibits a lower temperature than the same at arbitrary point 210. As another example, arbitrary point 210 exhibits a lower temperature than the same at arbitrary point 220. Conversely, FIG. 2 illustrates that the temperature decreases as the distance from transistor (T2) increases. For example, arbitrary point 230 exhibits a higher temperature than the same at arbitrary point 240. As another example, arbitrary point 240 exhibits a higher temperature than the same at arbitrary point 250.

Figure 3:
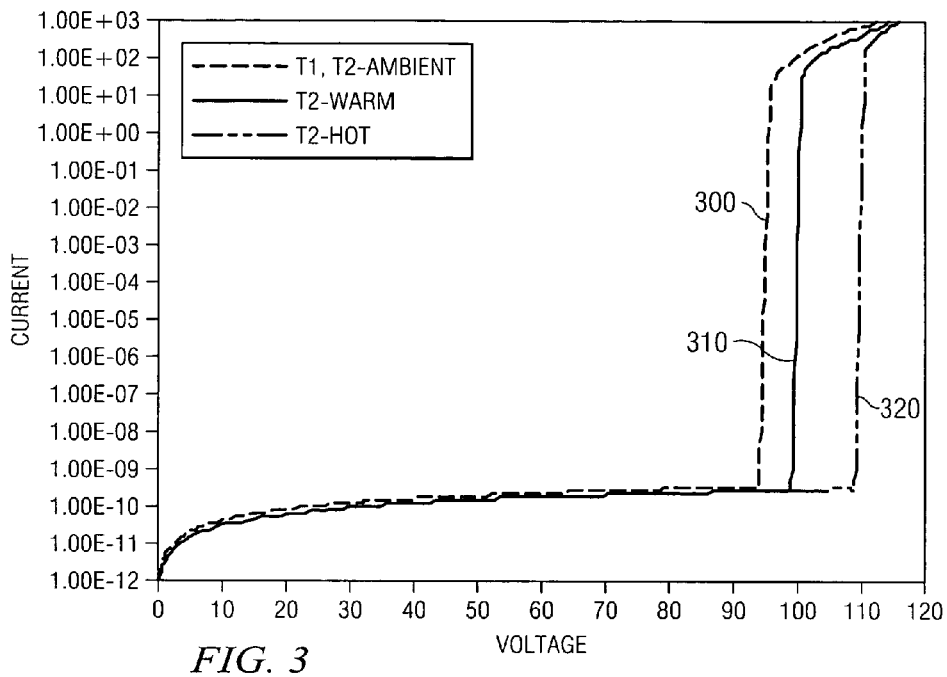
FIG. 3 illustrates an example breakdown voltage characteristic according to one embodiment of this disclosure.

The thermal gradient affects corresponding breakdown voltage characteristics as shown in FIG. 3. If during operation a large thermal gradient is present, the breakdown voltage is significantly affected. For example, referring to FIG. 3, when transistor (T1) and transistor (T2) are at an ambient temperature, breakdown voltage characteristic 300 is found. When transistor (T2) is at a relatively warm temperature, breakdown voltage characteristic 310 is observed. Finally, as transistor (T2) becomes hot, breakdown voltage characteristic 320 is observed. Therefore, as the temperature increases in transistor (T2), the breakdown voltage generally increases. However, the temperature increase in transistor (T2) does not substantially change the breakdown voltage characteristic of transistor (T1).

Under normal amplifier operation, there may be considerable power dissipation generated by transistor (T2), while no or little power is dissipated by transistor (T1). Infrared analysis of this condition demonstrates that the temperature of the diagnostic indicator (i.e., transistor (T1)) approaches that of a background temperature. Therefore, the breakdown voltage of transistor (T2) increases with corresponding increases in temperature and as power dissipation increases. The breakdown voltage characteristic of transistor (T1), however, remains substantially unchanged. Thus, as the supply voltage is increased, a detectable current due to a high voltage condition may first flow in transistor (T1), which is readily measured or detected with an IR sensor.

Alternatively, the effects of a high voltage condition in transistor (T1) may be used as input to controller circuit 120. Sub-circuit 110 thus provides quantitative levels of the voltage waveform present at the output circuit 130a within sub-circuit 130. Equation 1 describes the relationship between the breakdown voltage of transistor (T1) and the breakdown voltage of transistor (T2):

$$BV_{T1}(Temp1) \alpha k[BV_{T2}(Temp2)] \qquad (1)$$

where $BV_{T1}$ represents the breakdown voltage of transistor (T1), $BV_{T2}$ represents the breakdown voltage of transistor (T2), Temp1 represents the temperature of transistor (T1), and Temp2 represents the temperature of transistor (T2). As the voltage present in the output circuit 130a exceeds the breakdown voltage of transistor (T1), current flows within sub-circuit 110, resulting in a readily detectable IR signature.

Another method in accordance with one embodiment of this disclosure correlates quantitative measurements such that the actual voltage at the contact of transistor (T2) is realized. Thus, elevated voltage conditions can be easily discerned by, for example, using: (1) the actual temperature; (2) the emitted IR energy with a suitable detector; or (3) a current sensing circuit. Any of these features aid in diagnosing or controlling the amplifying stage, transistor (T2), via controller circuit 120.

In another embodiment in accordance with this disclosure, a diagnostic semiconductor (i.e., transistor (T1)) may be located on a second substrate either internally or externally from the package housing. Transistor (T1) may exhibit a specific breakdown voltage characteristic to accommodate a unique performance response of the amplifying stage. The controller circuit 120 may optionally be included on the same substrate as transistor (T1). Moreover, the controller circuit 120 may be optionally connected as required for amplifier performance.

Figure 4:
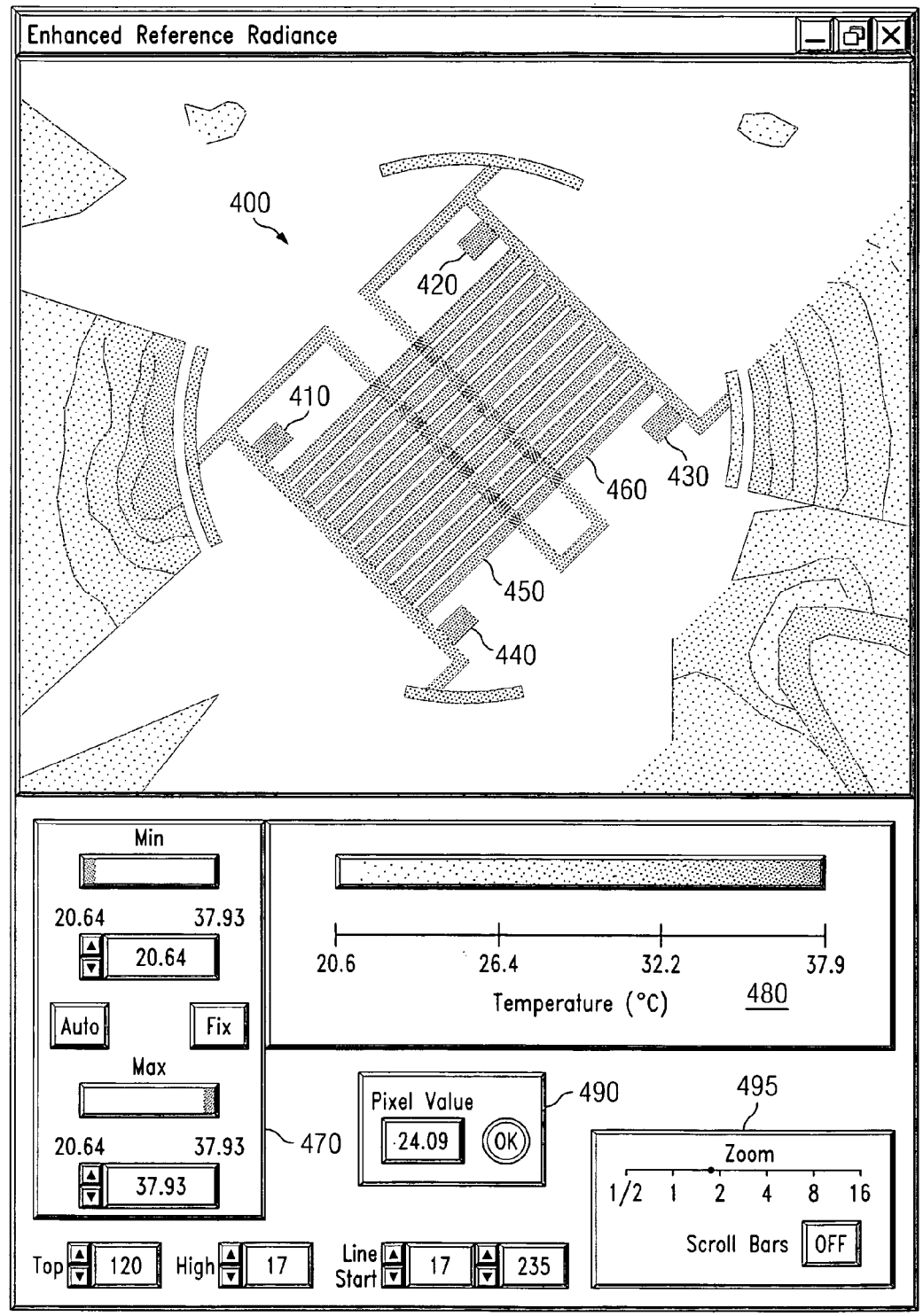
FIG. 4 illustrates an example infrared image of transistors in a high power transistor device according to one embodiment of the disclosure.

FIG. 4 illustrates an example infrared image 400 of four transistors 410, 420, 430 and 440 (i.e., four transistors (T1)) and two transistors 450 and 460 (i.e., two transistors (T2)) according to one embodiment of this disclosure. IR image 400 may be displayed in conjunction with an interface 470, where elements such as temperature 480, pixel value 490 and zoom value 495 may be exaggerated for further clarification and study. IR image 400 may be secured from, for example, an IR sensor or an image-capturing device.

Figure 5:
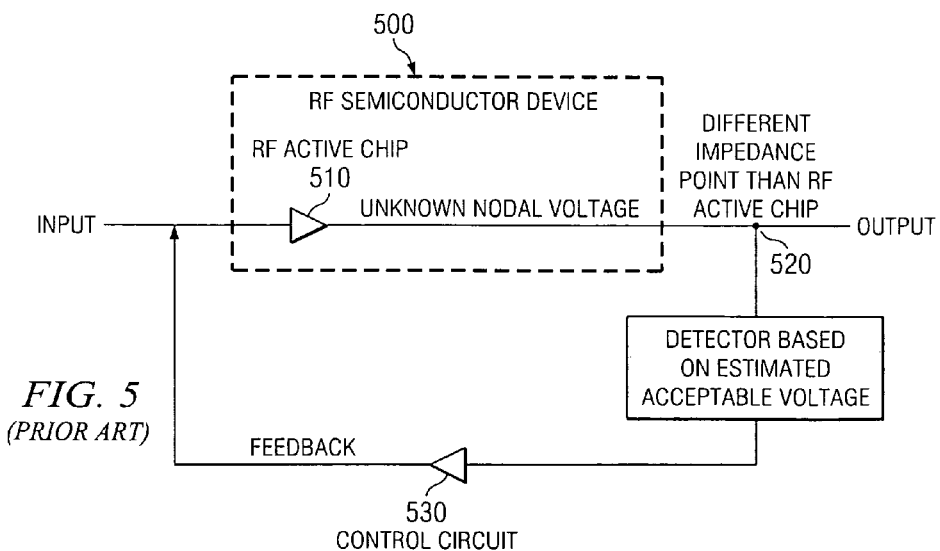
FIG. 5 illustrates an example prior art application for qualitatively diagnosing voltage conditions in high power transistor devices.

FIG. 5 illustrates an example prior art application for qualitatively diagnosing voltage conditions in high power transistor devices. In plasma excitation applications, a radio frequency (RF) semiconductor device 500, having an RF active chip 510, can be subjected to severe load mismatches in which voltages are in excess of the semiconductor device's parameters, thus causing fulmination. Device terminal voltages may be limited to an estimated value detected at impedance point 520 as depicted in FIG. 5. Impedance point 520 is not on RF semiconductor device 500. Thus, detecting and quantifying this voltage is complicated by the parasitic elements of an external detector in conjunction with an unknown nodal impedance. Moreover, detecting and quantifying this voltage is limited by the standardized voltage characteristic of the external detector and limitations of control circuit 530. The limitations on the estimated voltage negatively impacts the maximum available output power needed to ignite a plasma.

Figure 6:
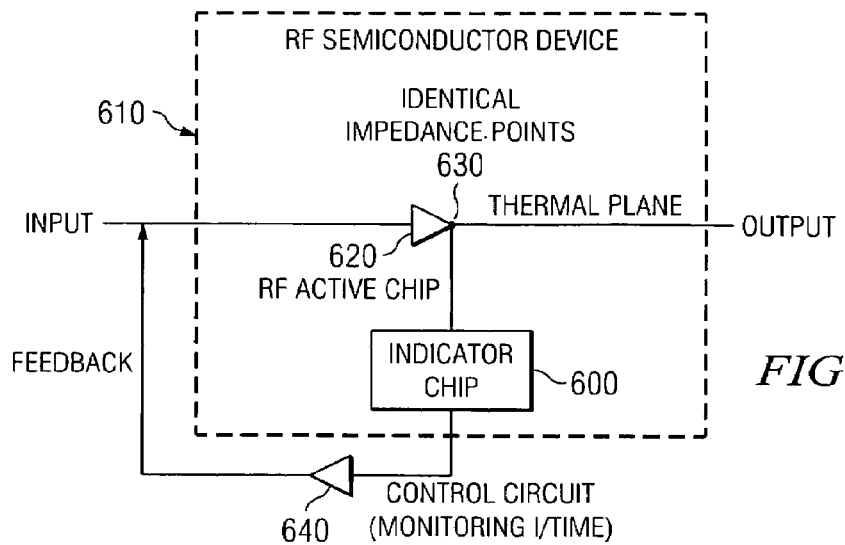
FIG. 6 illustrates an example application for quantitatively diagnosing voltage conditions in high power transistor devices in accordance with this disclosure.

As seen in FIG. 6, embodiments of a semiconductor indicator 600 for voltage diagnostics in accordance with this disclosure have the ability to allow semiconductor device 610, having RF active chip 620, to operate safely into an extreme load mismatch. By virtue of its voltage-current/RF characteristic, the voltage at internal terminal 630 is known due to the current through the semiconductor indicator 600. This current may be monitored for a predetermined time based on, for example, an avalanche rating/capability of active semiconductor device 610 and used to control various circuitry, such as control circuit 640, to remain in safe operation. Semiconductor device 610 may thus be operated at its highest power possible into high voltage phase angles, allowing more robust plasma ignition. Although plasma excitation applications represent one use of the principles of this disclosure, there are many other exemplary applications. For example, the principles of this disclosure may also be used in applications related to magnetic resonance imaging (MRI) systems and in communication systems. The principles of this disclosure may also have applicability to other types of transistorized amplifiers, including, for example, switch-mode power supplies (SMPS) and audio amplifiers. In addition, the principles of this disclosure may be used in laser applications.

Figure 7:
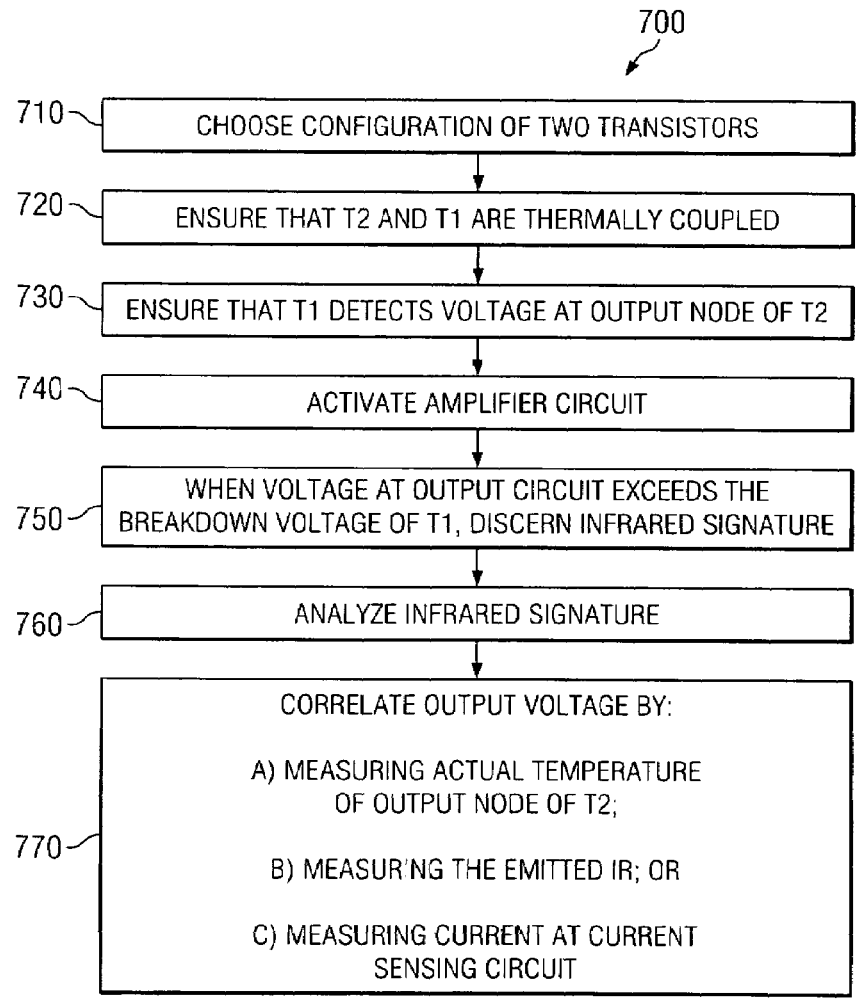
FIG. 7 illustrates an example method of using the system for quantitatively diagnosing voltage conditions in high power transistor devices according to one embodiment of this disclosure.

FIG. 7 illustrates an example method 700 of using the semiconductor indicator for voltage diagnostics in power amplifiers according to one embodiment of this disclosure. For example, the process may begin in Step 710 by choosing a configuration for two transistors, where the electrically active periphery of the first transistor (T2) is greater than the electrically active periphery of the second transistor (T1). Step 720 involves ensuring that the first transistor (T2) and the second transistor (T1) are thermally coupled to one another. Step 730 involves ensuring that the second transistor (T1) detects the voltage of a node on the first transistor (T2). After ensuring that the two transistors (T1 and T2) are correctly coupled to one another, the indicator of the present disclosure is ready to be activated. In Step 740, power amplifying circuitry is activated. In Step 750, when the voltage present at the output circuit 130a exceeds the breakdown voltage of the second transistor (T1), current flow results in a readily discernable infrared signature. Thus, in Step 760, the infrared signature may be analyzed to correlate quantitative measurements and ascertain the output voltage of the first transistor (T2). In Step 770, the output voltage may be correlated by measuring: (1) the actual temperature at the output node of the first transistor (T2); (2) the emitted IR energy with a suitable detector; or (3) the current at a current sensing circuit. It should be understood that any of the steps outlined above may be supplemented or repeated as desired.

Various embodiments of the present disclosure may provide one or more advantages over known systems and methods including, for example, providing a quantitative indication of voltage present at the lowest possible impedance node and aiding in the failure analysis of the amplifying semiconductor through evaluation of transistor (T1). By operating the transistor at the highest possible supply voltage, embodiments in accordance with the present disclosure maximize the power available for dissipation by the load network. The embodiments of the present disclosure also provide a system and method for readily obtaining quantitative measures of voltage amplitude present at the absolute contact node of the power semiconductor, thus minimizing the margin assigned between supply voltage and transistor breakdown voltage, optimizing performance and reducing operating costs.

Embodiments of the present disclosure also aid in predicting which operating conditions precipitate failures. In addition, the embodiments of the present disclosure may optimize performance by affecting the class of operation at the amplifier level. Finally, the present disclosure may eliminate foldback circuitry at the amplifier level and protect the amplifying semiconductor.

Although various embodiments are generally described for a particular vertical double-diffused metal oxide semiconductor (VDMOS) power transistor, the present disclosure may be applicable in other semiconductor technologies, such as bipolar and lateral DMOS (LDMOS) devices. In addition, while various embodiments of the present disclosure incorporate the diagnostic indicator and control circuitry on the same semiconductor substrate as the amplifying transistor, it should be understood by those skilled in the art that the detector/indicator (T1) and amplifying transistors (T2) may be on different substrates and situated some distance from one another. With the above understanding and goals, other alternative embodiments for semiconductor indicators for voltage diagnostics in power amplifiers may fall within the scope of this disclosure.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An indicator for voltage diagnostics in a power amplifier comprising:
   a first transistor having an electrically active periphery; and
   a second transistor having an electrically active periphery less than the electrically active periphery of the first transistor and thermally coupled to the first transistor;
   wherein a voltage of a node on the first transistor is detected using the second transistor; and
   wherein a ratio between the electrically active periphery of the first transistor and the electrically active periphery of the second transistor is large enough to at least one of:
   reduce a parasitic capacitance between the first transistor and the second transistor, and
   increase a sensitivity of the second transistor.

2. The indicator of claim 1, further comprising a control circuit.

3. The indicator of claim 2, further comprising an infrared sensor wherein an output of the infrared sensor is an input of the control circuit.

4. The indicator of claim 2, wherein the control circuit is situated on at least one of:
   a substrate common to the first transistor;
   a substrate common to the second transistor; and
   a substrate unique to either the first transistor or the second transistor.

5. The indicator of claim 2, wherein the voltage of the node on the first transistor is detected using the second transistor by at least one of:
   measuring an actual temperature at an output node of the first transistor;
   measuring emitted infrared energy with a detector; and
   using a current sensing circuit.

6. The indicator of claim 1, wherein a thermal gradient exists between the first transistor and the second transistor 1 the thermal gradient being proportional to a distance between the first transistor and the second transistor.

7. The indicator of claim 1, wherein a breakdown voltage characteristic of the second transistor does not substantially change as a temperature of the first transistor increases.

8. The indicator of claim 1, wherein the first transistor and the second transistor are situated on different substrates.

9. The indicator of claim 1, wherein the first transistor and the second transistor are situated on a common substrate.

10. The indicator of claim 1, wherein the voltage of the node on the first transistor is detected using the second transistor by at least one of:
   measuring an actual temperature at an output node of the first transistor;
   measuring emitted infrared energy with a detector; and
   using a current sensing circuit.

11. The indicator of claim 1, wherein the indicator is used in at least one of:
   a plasma generation application;
   magnetic resonance imaging system;
   a communication system;
   a switch-mode power supply;
   an audio amplifier; and
   a laser application.

12. A method for voltage diagnostics in a power amplifier, the method comprising:
   detecting a voltage of a node on a first transistor using a second transistor, the second transistor having an electrically active periphery less than an electrically active periphery of the first transistor and thermally coupled to the first transistor; and
   wherein a ratio between the electrically active periphery of the first transistor and the electrically active periphery of the second transistor is large enough to at least one of:
   reduce a parasitic capacitance between the first transistor and the second transistor, and
   increase a sensitivity of the second transistor.

13. The method of claim 12, further comprising using a control circuit to control operation of the power amplifier.

14. The method of claim 13, further comprising using an infrared sensor to capture an infrared image of the first and second transistors, wherein an output of the infrared sensor is an input of the control circuit.

15. The method of claim 13, wherein the control circuit is situated on at least one of: a substrate common to the first transistor; a substrate common to the second transistor; and a substrate unique to either the first transistor or the second transistor.

16. The method of claim 13, wherein the voltage is detected using a current sensing circuit.

17. The method of claim 12, wherein the voltage is detected by measuring an actual temperature at an output node of the first transistor using the second transistor.

18. The method of claim 12, wherein the voltage is detected by measuring emitted infrared energy of either the first transistor or the second transistor with a detector.

19. The method of claim 12, wherein the voltage is detected using a current sensing circuit.

20. The method of claim 12, wherein a breakdown voltage characteristic of the second transistor does not substantially change as a temperature of the first transistor increases.

* * * * *